US011438061B2

(12) United States Patent
Yang et al.

(10) Patent No.: US 11,438,061 B2
(45) Date of Patent: Sep. 6, 2022

(54) METHOD AND CORRESPONDING APPARATUS FOR REDUCING BACKLIGHT CROSSTALK IMPACT OF OPTICAL ASSEMBLY

(71) Applicant: Wuhan Telecommunication Devices Co., Ltd, Wuhan (CN)

(72) Inventors: Zhi Yang, Wuhan (CN); Shouqi Liu, Wuhan (CN); Jun Liu, Wuhan (CN)

(73) Assignee: Wuhan Telecommunication Devices Co., Ltd

( * ) Notice: Subject to any disclaimer, the term of this patent is extended or adjusted under 35 U.S.C. 154(b) by 0 days.

(21) Appl. No.: 17/266,848

(22) PCT Filed: Dec. 25, 2018

(86) PCT No.: PCT/CN2018/123309
§ 371 (c)(1),
(2) Date: Feb. 8, 2021

(87) PCT Pub. No.: WO2020/029517
PCT Pub. Date: Feb. 13, 2020

(65) Prior Publication Data
US 2021/0297153 A1    Sep. 23, 2021

(30) Foreign Application Priority Data
Aug. 9, 2018  (CN) .......................... 201810904819.9

(51) Int. Cl.
*H04B 10/58* (2013.01)
*H04B 10/079* (2013.01)

(52) U.S. Cl.
CPC ....... *H04B 10/07955* (2013.01); *H04B 10/58* (2013.01)

(58) Field of Classification Search
CPC .......... H04B 10/0773; H04B 10/07953; H04B 10/07955; H04B 10/58
See application file for complete search history.

(56) References Cited

U.S. PATENT DOCUMENTS

| 2007/0279615 A1 | 12/2007 | Degnan et al. |
| 2012/0195183 A1* | 8/2012 | Nuzman ............. H04B 7/0848 370/201 |

(Continued)

FOREIGN PATENT DOCUMENTS

| CN | 104897373 A | 9/2015 |
| CN | 107210780 A | 9/2017 |

(Continued)

OTHER PUBLICATIONS

Search Report from Chinese Application No. 2018109048199 filed Aug. 9, 2018; 1 page.

(Continued)

*Primary Examiner* — Dzung D Tran
(74) *Attorney, Agent, or Firm* — Lerner, David, Littenberg, Krumholz & Mentlik, LLP

(57) ABSTRACT

A method and corresponding apparatus for reducing a backlight crosstalk impact of an optical assembly. The method comprises: sequentially presetting two drive currents of a laser corresponding to a target wavelength channel as a first and second drive currents, respectively collecting backlight crosstalk data of the target wavelength channel to other wavelength channels, and generating a first and second crosstalk data matrix; carrying out fitting on the first and second crosstalk data matrix to acquire a crosstalk data calibration matrix; and calculating target backlight data of the target wavelength channel according to the crosstalk data calibration matrix, to calculate front light transmitting power of the target wavelength channel according to the target backlight data, thereby monitoring the optical assembly (Continued)

according to the front light transmitting power. The crosstalk impact can be reduced without an additional optical element, thereby improving accuracy of backlight detection and saving costs.

18 Claims, 2 Drawing Sheets

(56) References Cited

U.S. PATENT DOCUMENTS

| | | | |
|---|---|---|---|
| 2015/0077157 A1* | 3/2015 | Braunisch | H03K 19/0005 |
| | | | 326/30 |
| 2016/0226556 A1* | 8/2016 | Nuzman | H04B 3/32 |
| 2017/0187442 A1* | 6/2017 | Luddy | H04L 25/03898 |

FOREIGN PATENT DOCUMENTS

| | | |
|---|---|---|
| CN | 107367800 A | 11/2017 |
| CN | 107910741 A | 4/2018 |
| CN | 109066286 A | 12/2018 |

OTHER PUBLICATIONS

International Search Report for PCT/CN2018/123309 dated May 13, 2019; 2 pages.

* cited by examiner

US 11,438,061 B2

METHOD AND CORRESPONDING APPARATUS FOR REDUCING BACKLIGHT CROSSTALK IMPACT OF OPTICAL ASSEMBLY

CROSS-REFERENCE TO RELATED APPLICATIONS

The present application is a national phase entry under 35 U.S.C § 371 of International Application No. PCT/CN2018/123309 filed Dec. 25, 2018, which claims priority from Chinese Application No. 201810904819.9 filed Aug. 9, 2018, all of which are hereby incorporated herein by reference.

TECHNICAL FIELD

The present disclosure belongs to the field of optical assembly power detection, and more specifically, relates to a method and a corresponding apparatus for reducing a backlight crosstalk impact of an optical assembly.

BACKGROUND

A Transmitter Optical Subassembly (TOSA) is an important part of transmitting end of an optical assembly. In order to achieve a higher communication rate for the optical assembly, multiple lasers with different wavelengths are often integrated into one TOSA to meet communication requirements for a higher speed. Such transmitter optical assembly are called an integrated Transmitter Optical Assembly (integrated TOSA), and each part with a different wavelength is called a wavelength channel.

For an integrated TOSA, a method for detecting power of forward transmitting light (referred to as front light) or power of backward emission light (referred to as backlight) of a laser is generally adopted so as to detect the transmitting power level of each wavelength channel. When detecting power of forward light, an optical splitter is often used to introduce a part of the front light into an optical detector, which causes an advantage of high detection accuracy, but results in disadvantages of an increment of complexity and a reduction of output light power level. Therefore, detecting power of backlight is more common, that is, directly receiving backward transmitting light by an optical detector, and calculating the front light power by means of the approximate linear relationship between the power of backlight and that of front light.

In an integrated TOSA, an optical detector for a wavelength channel not only can receive backlight of the expected wavelength channel, but also may receive backlight of other wavelength channel through direct radiation, reflection, etc. This will cause crosstalk on backlight power detection of the expected wavelength channel, which reduces the accuracy of backlight detection. To solve this problem, a light-blocking element may be added to the TOSA to reduce crosstalk, but it will cause an increment of complexity, costs and more complicated in production processes.

In view of this, overcoming the defects existed in the prior arts are a problem to be solved urgently in this technical field.

SUMMARY

In view of the above defects and improvement requirements of the prior arts, the present disclosure provides a method and a corresponding apparatus for reducing a backlight crosstalk impact of an optical assembly, the objective of which is to reduce the crosstalk impact on backlight power detection of a wavelength channel without adding a light-blocking element, such that not only the accuracy of backlight detection is improved, but also costs are saved, thereby solving the technical problem of crosstalk of backlight power detection of an optical detector.

To achieve the above objective, according to a first aspect of the present disclosure, there is provided a method for reducing a backlight crosstalk impact of an optical assembly. The optical assembly comprises at least two wavelength channels. The method for reducing a backlight crosstalk impact of an optical assembly comprises: sequentially setting a laser drive current of a target wavelength channel as a first drive current, collecting backlight crosstalk data of the target wavelength channel to other wavelength channels, and generating a corresponding first crosstalk data matrix; sequentially setting another laser drive current of the target wavelength channel as a second drive current, collecting backlight crosstalk data of the target wavelength channel to other wavelength channels, and generating a corresponding second crosstalk data matrix; performing fitting on the first crosstalk data matrix and the second crosstalk data matrix to obtain a crosstalk data calibration matrix; calculating target backlight data of the target wavelength channel according to the crosstalk data calibration matrix, so as to calculate front light transmitting power of the target wavelength channel according to the target backlight data, thereby monitoring the optical assembly based on the front light transmitting power.

Preferably, the step of calculating target backlight data of the target wavelength channel according to the crosstalk data calibration matrix so as to calculate front light transmitting power of the target wavelength channel according to the target backlight data, comprises:

collecting backlight detection data of the target wavelength channel;

calculating a sum of crosstalk fitting data of crosstalk to backlight of the target wavelength channel based on the crosstalk data calibration matrix and working currents of other wavelength channels;

performing a subtraction operation between the backlight detection data and the crosstalk fitting data to acquire the target backlight data of the target wavelength channel, so as to calculate the front light transmitting power of the target wavelength channel according to the target backlight data, thereby monitoring the optical assembly according to the front light transmitting power.

Preferably, the step of calculating crosstalk data of the target wavelength channel based on the crosstalk data calibration matrix and working currents of other wavelength channels, comprises:

collecting the working current of each wavelength channel;

calculating crosstalk data of each wavelength channel to the target wavelength channel based on the crosstalk data calibration matrix and the working currents of other wavelength channels, and linearly adding up the crosstalk data to obtain the sum of crosstalk fitting data of crosstalk to the backlight of the target wavelength channel.

Preferably, the step of performing fitting on the first crosstalk data matrix and the second crosstalk data matrix to obtain a crosstalk data calibration matrix, comprises:

acquiring a slope matrix K and an intercept matrix B according to the first crosstalk data matrix and the second crosstalk data matrix;

performing linear fitting according to a first formula based on the slope matrix K and the intercept matrix B to acquire a crosstalk data calibration matrix Y;

the first formula being specifically:

$$Y=K\times I_i+B;$$

where $I_i$ represents a working current of an i-th wavelength channel.

Preferably, the optical assembly comprises n wavelength channels;

The step of sequentially setting a laser drive current of a target wavelength channel as a first drive current, collecting backlight crosstalk data of the target wavelength channel to other wavelength channels, and generating a corresponding first crosstalk data matrix, comprises:

setting the laser drive current of the i-th wavelength channel as a first drive current $I_P$, and turning off lasers of other wavelength channels, where 1≤i≤n;

collecting backlight crosstalk data $P_{ij}$ of the i-th wavelength channel to a j-th wavelength channel, where 1≤j≤n;

integrating the crosstalk data Pij to generate the corresponding first crosstalk data matrix.

Preferably, the step of sequentially setting another laser drive current of the target wavelength channel as a second drive current, collecting backlight crosstalk data of the target wavelength channel to other wavelength channels, and generating a corresponding second crosstalk data matrix, comprises:

setting another laser drive current of the i-th wavelength channel as a second drive current $I_q$, and turning off lasers of other wavelength channels, where 1≤i≤n;

collecting backlight crosstalk data $Q_{ij}$ of the i-th wavelength channel to a j-th wavelength channel, where 1≤j≤n;

integrating the crosstalk data $Q_{ij}$ to generate the corresponding second crosstalk data matrix.

Preferably, the step of sequentially setting a laser drive current of a target wavelength channel as a first drive current, collecting backlight crosstalk data of the target wavelength channel to other wavelength channels, and generating a corresponding first crosstalk data matrix, comprises:

setting the laser drive current of the i-th wavelength channel as a first drive current $I_P$, collecting backlight crosstalk data $P_{ij}$ of the i-th wavelength channel to a j-th wavelength channel, and integrating the crosstalk data $P_{ij}$ to generate the corresponding first crosstalk data matrix;

The step of sequentially setting another laser drive current of the target wavelength channel as a second drive current, collecting backlight crosstalk data of the target wavelength channel to other wavelength channels, and generating a corresponding second crosstalk data matrix, comprises:

setting another laser drive current of the i-th wavelength channel as a second drive current $I_q$, collecting backlight crosstalk data $Q_{ij}$ of the i-th wavelength channel to the j-th wavelength channel, and integrating the crosstalk data $Q_{ij}$ to generate the corresponding second crosstalk data matrix;

The step of performing fitting on the first crosstalk data matrix and the second crosstalk data matrix to obtain a crosstalk data calibration matrix, comprises:

acquiring a slope $K_{ij}$ according to a second formula, and integrating the slope $K_{ij}$ to obtain a slope matrix;

the second formula being specifically:

$$K_{ij} = \frac{P_{ij}-Q_{ij}}{I_P-I_q}$$

where the slope $K_{ij}$ represents the slope of the linear expression for the crosstalk data of the backlight of the i-th wavelength channel to the j-th wavelength channel;

acquiring an intercept Bij according to a third formula, and integrating the intercept Bij to obtain an intercept matrix;

the third formula being specifically:

$$B_{ij} = \frac{Q_{ij}\times I_p - P_{ij}\times I_q}{I_P-I_q}$$

where the intercept $B_{ij}$ represents an intercept of the linear expression for the crosstalk data of the backlight of the i-th wavelength channel to the j-th wavelength channel;

based on the slope $K_{ij}$ and the intercept $B_{ij}$, performing linear fitting according to a fourth formula to obtain a crosstalk data linear expression $Y_{ij}$ for the backlight crosstalk of the i-th wavelength channel to the j-th wavelength channel, and integrating the crosstalk data linear expression $Y_{ij}$ to obtain the crosstalk data calibration matrix;

the fourth formula being specifically: $Y_{ij}=K_{ij}\times I_i+B_{ij}$ where $I_i$ represents the working current of the i-th wavelength channel.

Preferably, the step of calculating target backlight data of the target wavelength channel according to the crosstalk data calibration matrix, so as to calculate front light transmitting power of the target wavelength channel according to the target backlight data, comprises:

calculating a sum $C_m$ of crosstalk fitting data of crosstalk to a target wavelength channel m according to a fifth formula based on the crosstalk data calibration matrix;

the fifth formula being specifically:

$$C_m = \sum_{j=m}^{1\leq i\leq n} Y_{ij}$$

where 1≤m≤n;

calculating the target backlight data of the target wavelength channel based on the crosstalk fitting data sum $C_m$, so as to calculate the front light transmitting power of the target wavelength channel according to the target backlight data, thereby monitoring the optical assembly according to the front light transmitting power.

Preferably, the step of calculating the target backlight data of the target wavelength channel based on crosstalk data $C_m$, so as to calculate the front light transmitting power of the target wavelength channel according to the target backlight data, comprises:

collecting backlight detection data $D_m$ of the target wavelength channel m;

calculating target backlight data $D'_m$ of the target wavelength channel m according to a formula $D'_m=D_m-C_m$;

calculating the front light transmitting power of the target wavelength channel according to the target backlight data $D'_m$, so as to monitor the optical assembly according to the front light transmitting power.

According to the second aspect of the present invention, there is provided an apparatus for reducing backlight crosstalk of an optical assembly. The apparatus for reducing backlight crosstalk of an optical assembly comprises at least one processor; and a memory communicatively connected with the at least one processor, wherein the memory stores instructions executable by the at least one processor, and the instructions are configured by a program to execute the method for reducing a backlight crosstalk impact of an optical assembly in the first aspect.

In general, compared with the prior arts, the above technical solutions conceived by the present disclosure have the following beneficial effects: in the present disclosure, firstly, sequentially collecting the backlight crosstalk data of the target wavelength channel to other wavelength channels at two different drive current; then determining the crosstalk data function expression of the target wavelength channel to other wavelength channels by a fitting method; and then by using a linear superposition method, calculating the sum of crosstalk fitting data of crosstalk of the other wavelength channels to the target wavelength channel; finally, subtracting the sum of crosstalk fitting data of crosstalk to the target wavelength channel from backlight detection data of the target wavelength channel, to obtain a more accurate target backlight data and then a more accurate front light transmitting power, which can reduce the backlight crosstalk impact. In the present disclosure, crosstalk to backlight detection power of a wavelength channel can be reduced without adding an additional light blocking element, such that the backlight crosstalk impact can be reduced, the accuracy of backlight detection can be improved, and thus a more accurate front light transmitting power is obtained, thereby well monitoring an optical assembly and meanwhile, saving the cost and reducing the process difficulty.

DETAILED DESCRIPTION

In order to make the objectives, technical solutions and advantages of the present invention clearer, the present disclosure is further described in detail with reference to the accompanying drawings and embodiments hereinafter. It should be understood that the specific embodiments described herein are only used to explain, but not to limit, the present disclosure. In addition, the technical features involved in various embodiments of the present disclosure described below can be combined with each other as long as they do not conflict with each other.

At present, in order to ensure that front light transmitting power of a transmitter optical assembly with multiple wavelength channels meets actual needs, a backlight monitoring method is regularly used to monitor front light transmitting power. For example, when the front light transmitting power of a certain wavelength channel is not within a preset range, drive current of the laser is adaptively adjusted in real time to meet actual needs. However, in addition to receive backlight of the laser of expected wavelength channel, an optical detector may also receive backlight of other lasers of other wavelength channels through direct radiation, reflection, etc., resulting in crosstalk to backlight power detection of the expected wavelength channel, which causes an inaccurate backlight detection result and then affects the frontlight monitoring accuracy. In order to solve the aforementioned problem, the present disclosure provides a method for reducing a backlight crosstalk impact of an optical assembly, by which the crosstalk of backlight of other wavelength channels to the target wavelength channel can be eliminated to the greatest extent, and the value of backlight power of the target wavelength channel can be obtained more accurately, so that the front light power of the target wavelength channel can be calculated more accurately, thereby monitoring each wavelength channel of the optical assembly.

Example 1

Figure 1:
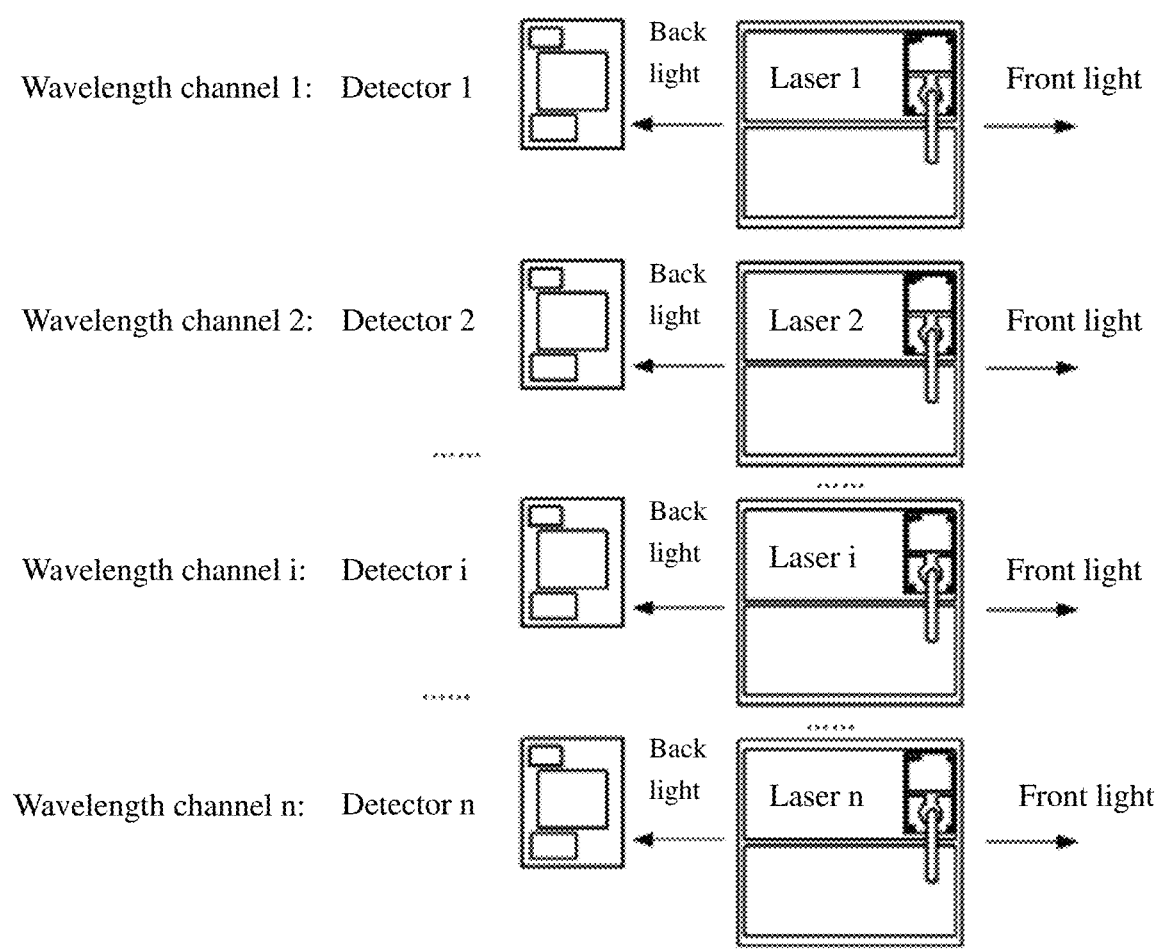
FIG. 1 is a schematic diagram of the structure of an optical assembly of the present disclosure.

Referring to FIG. 1, in this embodiment, an optical assembly comprises n wavelength channels, where n≥2. Each wavelength channel is correspondingly configured with a laser and an optical detector. Front light transmitted by the laser is used to transmit data, and the optical detector is used to detect backlight of a corresponding wavelength channel. The power of front light can be acquired indirectly by collecting the power of backlight because the power of front light and the power of backlight satisfy a certain mapping relationship. In order to ensure the accuracy of detection result of an optical detector to obtain accurate backlight data, and then to calculate the front light transmitting power, the method for reducing a backlight crosstalk impact proposed by the present disclosed can be adopted.

Figure 2:
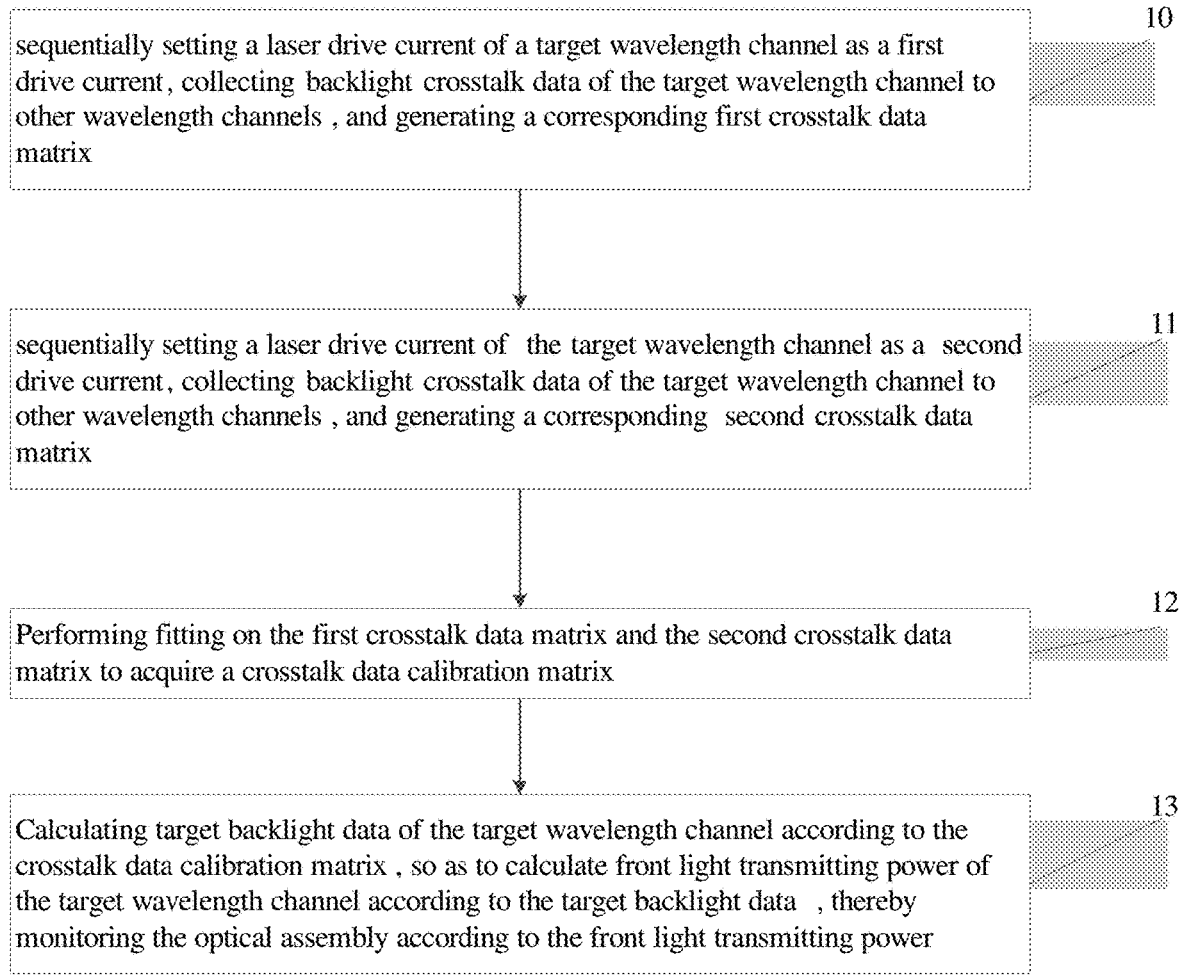
FIG. 2 is a schematic flowchart of a method for reducing a backlight crosstalk impact of an optical assembly according to an embodiment of the present disclosure.

Referring to FIG. 2 hereinafter, the method for reducing a backlight crosstalk impact of an optical assembly of the present disclosure will be specifically described. The method specifically comprises the following steps:

Step 10: sequentially setting a laser drive current of a target wavelength channel as a first drive current, collecting backlight crosstalk data of the target wavelength channel to other wavelength channels, and generating a corresponding first crosstalk data matrix.

The optical assembly of this embodiment is an integrated transmitter optical assembly TOSA, which is mainly used in the field of optical communications. The optical assembly comprises at least two wavelength channels, and each wavelength channel corresponds to a different laser wavelength. The laser wavelength can be 850 nm or 1310 nm, or 1550 nm, etc. The laser wavelength of each wavelength channel can be determined according to actual situations, and is not specifically limited here. At the same time, the number of wavelength channels comprised in the optical assembly depends on actual conditions, such as 2, 4, or 8, and is specifically limited here.

In this embodiment, firstly, a drive current of a laser corresponding to a target wavelength channel is set as a first drive current, backlight crosstalk data of the target wavelength channel to other wavelength channels is collected, and a corresponding first crosstalk data matrix is generated. The range of the first drive current depends on the laser parameters. For example, if the range of laser drive current is 10 mA~100 mA, the first drive current can be any value within 10 mA~100 mA.

In an actual application scenario, the optical assembly comprises n wavelength channels, where n≥2. The first crosstalk data matrix can be obtained according to the following steps.

Firstly, the laser drive current of i-th wavelength channel is set according to the first drive current $I_P$, and shut down all the other lasers where $1 \leq i \leq n$. Then, backlight crosstalk data $P_{ij}$ of the i-th wavelength channel to the j-th wavelength channel is collected, where $1 \leq j \leq n$. Finally, the crosstalk data $P_{ij}$ is integrated to generate a corresponding first crosstalk data matrix $A_1$.

Specifically, the laser drive current of the first wavelength channel is set according to the first drive current $I_P$, and shutdown all the other lasers, and backlight crosstalk date $P_{11}, P_{12} \ldots P_{1j} \ldots P_{1n}$ of the first wavelength channel to the j-th wavelength channel is collected. The laser drive current of the second wavelength channel is set according to the first drive current $I_P$, and shutdown all the other lasers, and backlight crosstalk data $P_{21}, P_{22} \ldots P_{2j} \ldots P_{2n}$ of the second wavelength channel to the j-th wavelength channel is collected. By analogy, the laser drive current of the n-th wavelength channel is set as a first drive current $I_P$, lasers of other wavelength channels other than the n-th wavelength channel are shut down, and backlight crosstalk data $P_{n1}$, $P_{n2} \ldots P_{nj} \ldots P_{nn}$ of the n-th wavelength channel to the j-th wavelength channel is collected.

Here, it should be noted that when i=j, that is, $P_{11}$, $P_{22} \ldots P_{nn}$ represent the backlight data of crosstalk of wavelength channels 1, 2 . . . n to itself, so $P_{11} = P_{22} = \ldots = P_{nn} = 0$.

The first crosstalk data matrix $A_1$ is as follows, wherein every row of the first crosstalk data matrix $A_1$ is the backlight crosstalk data of a target wavelength channel (i is a fixed value) to other wavelength channels, and every column of the first crosstalk data matrix $A_1$ is the backlight crosstalk data of other wavelength channels to the target wavelength channel (j is a fixed value), $$A_1 = \begin{bmatrix} P_{11} & P_{12} & \ldots & P_{1j} & \ldots & P_{1n} \\ P_{21} & P_{22} & \ldots & P_{2j} & \ldots & P_{2n} \\ \ldots & \ldots & \ldots & \ldots & \ldots & \ldots \\ P_{i1} & P_{i2} & \ldots & P_{ij} & \ldots & P_{in} \\ \ldots & \ldots & \ldots & \ldots & \ldots & \ldots \\ P_{n1} & P_{n2} & \ldots & P_{nj} & \ldots & P_{nn} \end{bmatrix}$$

By substituting $P_{11} = P_{22} = \ldots = P_{nn} = 0$ into the first crosstalk data matrix $A_1$, the first crosstalk data matrix $A_t$ can be obtained as:

$$A_1 = \begin{bmatrix} 0 & P_{12} & \ldots & P_{1j} & \ldots & P_{1n} \\ P_{21} & 0 & \ldots & P_{2j} & \ldots & P_{2n} \\ \ldots & \ldots & 0 & \ldots & \ldots & \ldots \\ P_{i1} & P_{i2} & \ldots & 0 & \ldots & P_{in} \\ \ldots & \ldots & \ldots & \ldots & 0 & \ldots \\ P_{n1} & P_{n2} & \ldots & P_{nj} & \ldots & 0 \end{bmatrix}$$

Step 11: sequentially setting the laser drive current of the target wavelength channel according to the second drive current, collecting backlight crosstalk data of the target wavelength channel to other wavelength channels, and generating a corresponding second crosstalk data matrix.

In this embodiment, firstly, a drive current of the laser corresponding to the target wavelength channel is set as the second drive current, then backlight crosstalk data of the target wavelength channel to other wavelength channels is collected, and a corresponding second crosstalk data matrix is generated. The range of the second drive current depends on the laser parameters. For example, the range of the drive current of the laser is 10 mA-100 mA, then the second drive current can be any value from the range of 10 mA-100 mA.

In this embodiment, the first drive current and the second drive current have different values, and can be set correspondingly according to actual conditions.

In an actual application scenario, the optical assembly comprises n wavelength channels, where n≥2. The second crosstalk data matrix can be acquired according to the following steps.

Firstly, the laser drive current of the i-th wavelength channel is set according to the second drive current Iq, and all the other lasers are shut down, where 1≤i≤n. Then, backlight crosstalk data $Q_{ij}$ of the i-th wavelength channel to a j-th wavelength channel is collected, where 1≤j≤n. Finally, the crosstalk data $Q_{ij}$ is integrated to generate a corresponding second crosstalk data matrix $A_2$.

Specifically, the laser drive current of the first wavelength channel is set according to the second drive current $I_q$, and all the other lasers are shut down, then backlight crosstalk data $Q_{11}, Q_{12}, \ldots Q_{1j} \ldots Q_{1n}$ of the first wavelength channel to the j-th wavelength channel is collected. The laser drive current of the second wavelength channel is set according to the second drive current $I_q$, and all the other lasers are shut down, then backlight crosstalk data $Q_{21}, Q_{22} \ldots Q_{2j} \ldots Q_{2n}$ of the second wavelength channel to the j-th wavelength channel is collected. By analogy, the laser drive current of the n-th wavelength channel is set according to second drive current $I_q$, and all the other lasers are shut down, then backlight crosstalk data Qn1, Qn2 . . . Qnj . . . Qnn of the n-th wavelength channel to the j-th wavelength channel is collected.

Here, it should be noted that when i=j, that is, $Q_{11}$, $Q_{22} \ldots Q_{nn}$ represent the backlight crosstalk data of wavelength channels 1, 2 . . . n to themselves respectively, so $Q_{11} = Q_{22} = \ldots = Q_{nn} = 0$.

The second crosstalk data matrix $A_2$ is as follows, wherein every row of the second crosstalk data matrix $A_2$ is the backlight crosstalk data of the target wavelength channel (i is a fixed value) to other wavelength channels, and every column of it is the backlight crosstalk data of other wavelength channels to the target wavelength channel (j is a fixed value), $$A_2 = \begin{bmatrix} Q_{11} & Q_{12} & \ldots & Q_{1j} & \ldots & Q_{1n} \\ Q_{21} & Q_{22} & \ldots & Q_{2j} & \ldots & Q_{2n} \\ \ldots & \ldots & \ldots & \ldots & \ldots & \ldots \\ Q_{i1} & Q_{i2} & \ldots & Q_{ij} & \ldots & Q_{in} \\ \ldots & \ldots & \ldots & \ldots & \ldots & \ldots \\ Q_{n1} & Q_{n2} & \ldots & Q_{nj} & \ldots & Q_{nn} \end{bmatrix}$$

$Q_{11} = Q_{22} = \ldots = Q_{nn} = 0$ is substituted into the second crosstalk data matrix $A_2$, then the second crosstalk data matrix $A_2$ can be obtained as:

$$A_2 = \begin{bmatrix} 0 & Q_{12} & \ldots & Q_{1j} & \ldots & Q_{1n} \\ Q_{21} & 0 & \ldots & Q_{2j} & \ldots & Q_{2n} \\ \ldots & \ldots & 0 & \ldots & \ldots & \ldots \\ Q_{i1} & Q_{i2} & \ldots & 0 & \ldots & Q_{in} \\ \ldots & \ldots & \ldots & \ldots & 0 & \ldots \\ Q_{n1} & Q_{n2} & \ldots & Q_{nj} & \ldots & 0 \end{bmatrix}$$

Step 12: Performing fitting on the first crosstalk data matrix and the second crosstalk data matrix to acquire a crosstalk data calibration matrix.

The fitting may be linear fitting or nonlinear fitting, such as exponential fitting or quadratic fitting. However, due to the linear characteristics of a laser itself, the backlight crosstalk of a certain wavelength channel to other wavelength channels is approximately linear. In an actual application scenario, a linear fitting method can eliminate the crosstalk quite well. Therefore, a linear fitting method may be used in a preferred embodiment, if the same effect can be achieved, in order to reduce the amount of calculation and improve efficiency.

The process of linear fitting is specifically described as follows.

In this embodiment, the data of first crosstalk data matrix A1 and the second crosstalk data matrix A2 are linearly fitted, and a slope matrix K and an intercept matrix B are acquired according to the first crosstalk data matrix A1 and the second crosstalk data matrix $A_2$, and a crosstalk data calibration matrix Y is acquired according to the slope matrix K and the intercept matrix B.

Specifically, the crosstalk data calibration matrix Y is acquired by performing linear fitting based on the slope matrix K and the intercept matrix B according to a following formula (1);

$$Y = K \times I_i + B \quad (1)$$

Where $I_i$ represents the working current of the i-th wavelength channel.

The process of acquiring the crosstalk data calibration matrix Y will be specifically described below.

Firstly, the slope $K_{ij}$ according to a following formula (2), and the slope matrix K is acquired by integrating the slope $K_{ij}$;

$$K_{ij} = \frac{P_{ij} - Q_{ij}}{I_p - I_q} \quad (2)$$

where the slope $K_{ij}$ represents the slope of the linear expression for crosstalk data of the backlight of the i-th wavelength channel to the j-th wavelength channel.

That is, the expression of the slope matrix K is as follows:

$$K = \begin{bmatrix} K_{11} & K_{12} & \cdots & K_{1j} & \cdots & K_{1n} \\ K_{21} & K_{22} & \cdots & K_{2j} & \cdots & K_{2n} \\ \cdots & \cdots & \cdots & \cdots & \cdots & \cdots \\ K_{i1} & K_{i2} & \cdots & K_{ij} & \cdots & K_{in} \\ \cdots & \cdots & \cdots & \cdots & \cdots & \cdots \\ K_{n1} & K_{n2} & \cdots & K_{nj} & \cdots & K_{nn} \end{bmatrix}$$

The slope matrix K is obtained as follows according to the first crosstalk data matrix $A_1$, the second crosstalk data matrix $A_2$, and the formula (2):

$$K = \begin{bmatrix} 0 & \frac{P_{12} - Q_{12}}{I_p - I_q} & \cdots & \frac{P_{1j} - Q_{1j}}{I_p - I_q} & \cdots & \frac{P_{1n} - Q_{1n}}{I_p - I_q} \\ \frac{P_{21} - Q_{21}}{I_p - I_q} & 0 & \cdots & \frac{P_{2j} - Q_{2j}}{I_p - I_q} & \cdots & \frac{P_{2n} - Q_{2n}}{I_p - I_q} \\ \cdots & \cdots & 0 & \cdots & \cdots & \cdots \\ \frac{P_{i1} - Q_{i1}}{I_p - I_q} & \frac{P_{i2} - Q_{i2}}{I_p - I_q} & \cdots & 0 & \cdots & \frac{P_{in} - Q_{in}}{I_p - I_q} \\ \cdots & \cdots & \cdots & \cdots & 0 & \cdots \\ \frac{P_{n1} - Q_{n1}}{I_p - I_q} & \frac{P_{n2} - Q_{n2}}{I_p - I_q} & \cdots & \frac{P_{nj} - Q_{nj}}{I_p - I_q} & \cdots & 0 \end{bmatrix}$$

The intercept B is acquired according to a following formula (3), and then is integrated to obtain the intercept matrix B;

$$B_{ij} = \frac{Q_{ij} \times I_p - P_{ij} \times I_q}{I_p - I_q} \quad (3)$$

Where the intercept $B_{ij}$ represents the intercept of the linear expression for the backlight of the i-th wavelength channel to the j-th wavelength channel.

That is, the expression of the intercept matrix B is as follows:

$$B = \begin{bmatrix} B_{11} & B_{12} & \cdots & B_{1j} & \cdots & B_{1n} \\ B_{21} & B_{22} & \cdots & B_{2j} & \cdots & B_{2n} \\ \cdots & \cdots & \cdots & \cdots & \cdots & \cdots \\ B_{i1} & B_{i2} & \cdots & B_{ij} & \cdots & B_{in} \\ \cdots & \cdots & \cdots & \cdots & \cdots & \cdots \\ B_{n1} & B_{n2} & \cdots & B_{nj} & \cdots & B_{nn} \end{bmatrix}$$

The intercept matrix $B_{ij}$ as follows, is obtained according to the first crosstalk data matrix A1, the second crosstalk data matrix A2, and the formula (3):

$$B = \begin{bmatrix} 0 & \frac{Q_{12} \times I_p - P_{12} \times I_q}{I_p - I_q} & \cdots & \frac{Q_{1j} \times I_p - P_{1j} \times I_q}{I_p - I_q} & \cdots & \frac{Q_{1n} \times I_p - P_{1n} \times I_q}{I_p - I_q} \\ \frac{Q_{21} \times I_p - P_{21} \times I_q}{I_p - I_q} & 0 & \cdots & \frac{Q_{2j} \times I_p - P_{2j} \times I_q}{I_p - I_q} & \cdots & \frac{Q_{2n} \times I_p - P_{2n} \times I_q}{I_p - I_q} \\ \cdots & \cdots & 0 & \cdots & \cdots & \cdots \\ \frac{Q_{i1} \times I_p - P_{i1} \times I_q}{I_p - I_q} & \frac{Q_{i2} \times I_p - P_{i2} \times I_q}{I_p - I_q} & \cdots & 0 & \cdots & \frac{Q_{in} \times I_p - P_{in} \times I_q}{I_p - I_q} \\ \cdots & \cdots & \cdots & \cdots & 0 & \cdots \\ \frac{Q_{n1} \times I_p - P_{n1} \times I_q}{I_p - I_q} & \frac{Q_{n2} \times I_p - P_{n2} \times I_q}{I_p - I_q} & \cdots & \frac{Q_{nj} \times I_p - P_{nj} \times I_q}{I_p - I_q} & \cdots & 0 \end{bmatrix}$$

Based on the slope $K_{ij}$ and the intercept $B_{ij}$, linear fitting is performed according to a formula (4) to obtain the crosstalk data function expression $Y_{ij}$, and the crosstalk data function expression $Y_{ij}$ is integrated to obtain the crosstalk data calibration matrix Y.

$$Y_{ij}=K_{ij}\times Ii+B_{ij} \qquad (4)$$

Where $I_i$ represents the working current of the i-th wavelength channel.

That is, the expression of the crosstalk data calibration matrix Y is as follows:

$$Y = \begin{bmatrix} Y_{11} & Y_{12} & \ldots & Y_{1j} & \ldots & Y_{1n} \\ Y_{21} & Y_{22} & \ldots & Y_{2j} & \ldots & Y_{2n} \\ \ldots & \ldots & \ldots & \ldots & \ldots & \ldots \\ Y_{i1} & Y_{i2} & \ldots & Y_{ij} & \ldots & Y_{in} \\ \ldots & \ldots & \ldots & \ldots & \ldots & \ldots \\ Y_{n1} & B_{n2} & \ldots & Y_{nj} & \ldots & Y_{nn} \end{bmatrix}$$

Based on the slope K, the intercept B and the formula (4), the crosstalk data calibration matrix Y is obtained as follows:

$$Y = \begin{bmatrix} 0 & K_{12}\times I_1+B_{12} & \ldots & K_{1j}\times I_1+B_{1j} & \ldots & K_{1n}\times I_1+B_{1n} \\ K_{21}\times I_2+B_{21} & 0 & \ldots & K_{2j}\times I_2+B_{2j} & \ldots & K_{2n}\times I_2+B_{2n} \\ \ldots & \ldots & 0 & \ldots & \ldots & \ldots \\ K_{i1}\times I_i+B_{i1} & K_{i2}\times I_i+B_{i2} & \ldots & 0 & \ldots & K_{in}\times I_i+B_{in} \\ \ldots & \ldots & \ldots & \ldots & 0 & \ldots \\ K_{n1}\times I_n+B_{n1} & K_{n2}\times I_n+B_{n2} & \ldots & K_{nj}\times I_n+B_{nj} & \ldots & 0 \end{bmatrix}$$

Where the i-th row of the crosstalk data calibration matrix Y represents the crosstalk data of the i-th wavelength channel to other wavelength channels, and the j-th column represents the crosstalk data to the j-th wavelength channel from other wavelength channels.

Step 13: Calculating target backlight data of the target wavelength channel according to the crosstalk data calibration matrix, so as to calculate front light transmitting power of the target wavelength channel according to the target backlight data, thereby monitoring the optical assembly according to the front light transmitting power.

In this embodiment, the backlight detection data of the target wavelength channel is collected; the sum of crosstalk fitting data of backlight crosstalk to the target wavelength channel is calculated based on the crosstalk data calibration matrix and working currents of other wavelength channels; and a subtraction operation is performed between the backlight detection data and the sum of the crosstalk fitting data to acquire the target backlight data of the target wavelength channel, so as to calculate the front light transmitting power of the target wavelength channel according to the target backlight data, thereby monitoring the optical assembly according to the front light transmitting power. Specifically, when the optical assembly is working normally, the working current of each wavelength channel is collected; the crosstalk data of each wavelength channel to the target wavelength channel is calculated based on the crosstalk data calibration matrix and the working currents of other wavelength channels, and the crosstalk data of each wavelength channel to the target wavelength channel are linearly added up to obtain the sum of crosstalk fitting data of backlight crosstalk to the target wavelength channel.

In an actual application scenario, a linear accumulation method is used to calculate the sum of crosstalk fitting data of crosstalk to the target wavelength channel m, where $1\le m\le n$. For example, the sum of crosstalk fitting data of crosstalk to the first wavelength channel from other wavelength channels is $$C_1 = \sum_{j=1}^{1\le i\le n} Y_{i1} = Y_{11}+Y_{21}+\ldots+Y_{21},$$

the sum of crosstalk fitting data of crosstalk to the n-th wavelength channel from other wavelength channels is $$C_n = \sum_{j=n}^{1\le i\le n} Y_{in} = Y_{1n}+Y_{2n}+\ldots+Y_{2n}.$$

In an actual application scenario, when the optical assembly is working normally (the drive current corresponding to each wavelength channel is a normal working current), firstly, the backlight detection data $D_m$ of the target wavelength channel m is collected; then the crosstalk fitting data sum $C_m$ of crosstalk to the target wavelength channel m is calculated based on the crosstalk data calibration matrix Y and working currents $I_i$ of other wavelength channels; a subtraction operation is performed between the backlight detection data and the sum of crosstalk fitting data to obtain target backlight data $D'_m$ of the target wavelength channel m, that is, $D'_m=D_m-C_m$. Then, the front light transmitting power of the target wavelength channel is calculated according to the target backlight data $D'_m$, so as to monitor the optical assembly according to the front light transmitting power. For example, when the front light transmitting power is greater than or less than a preset power range, the current of the optical assembly can be adjusted so that the front light transmitting power of the target wavelength channel meets the preset power range, thereby meeting actual requirements.

Here, it should be noted that the target backlight data in this embodiment is relatively accurate backlight data, which is the backlight data that the backlight detection data subtracts the sum of the fitted crosstalk data received from all the other wavelength channels.

In an alternative embodiment, the crosstalk data calibration matrix can be acquired in a segmented calibration manner. Specifically, firstly, the different current segments are divided according to the working current of the optical assembly, and the first drive current and the second drive current are selected from different current segments to respectively obtain the crosstalk data calibration matrix of corresponding current segment. When the backlight data of the target channel is calculated, firstly, the current segment in which the drive current of each wavelength channel falls is determined, and then the crosstalk data of the wavelength channel to the target channel is obtained through the crosstalk data calibration matrix corresponding to the current segment, and finally the sum of crosstalk fitting data of crosstalk to the wavelength channel is calculated.

The calculation method for the calibration matrix of crosstalk data corresponding to each current segment is the same as the foregoing method, and will not be repeated herein.

In an actual application, the method for reducing the backlight crosstalk impact of the optical assembly in this embodiment can be automatically completed by a software algorithm in an automatic production system. The method for reducing the crosstalk of backlight of the optical assembly provided by the present embodiment does not require an additional light-blocking element, thereby helping to reduce costs and simplify the production process.

Different from the prior arts, the present invention comprises: first sequentially collecting the backlight crosstalk data of the target wavelength channel to other wavelength channels at two different drive currents; then determining the function relationship expression for the crosstalk data of the target wavelength channel to other wavelength channels by using the fitting method; then calculating, by using the linear accumulation method, the sum of crosstalk fitting data of crosstalk of other wavelength channels to the target wavelength channel; finally, subtracting the sum of the crosstalk fitting data of all the other wavelength channels to obtain relatively accurate target backlight data and then relatively accurate front light transmitting power, thereby reducing the backlight crosstalk impact. By the present disclosure, the crosstalk of backlight detection power of the wavelength channel can be reduced without an additional light-blocking element, such that the backlight crosstalk impact can be reduced, and the accuracy of backlight detection can be improved, further more accurate front light transmitting power can be obtained, thereby achieving a good monitoring to an optical assembly and meanwhile, saving the costs and reducing the process difficulty.

Embodiment 2

Figure 3:
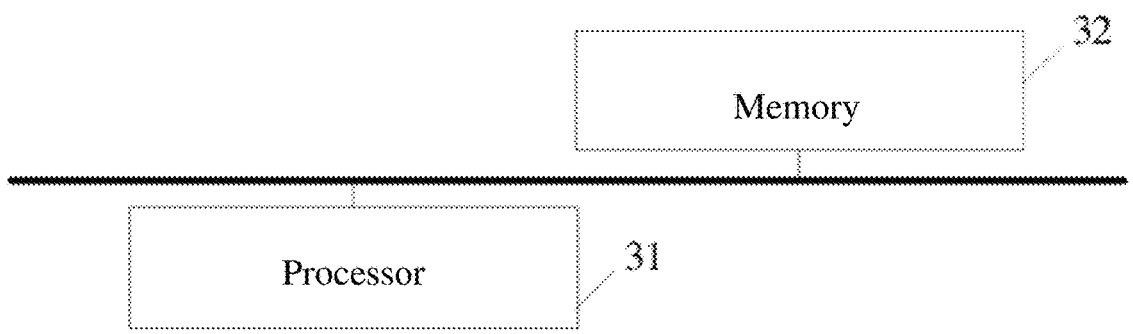
FIG. 3 is a schematic structural diagram of an apparatus for reducing backlight crosstalk of an optical assembly provided by an embodiment of the present disclosure.

FIG. 3 is a schematic structural diagram of an apparatus for reducing backlight crosstalk of an optical assembly provided by an embodiment of the present disclosure. The apparatus for reducing backlight crosstalk of an optical assembly in this embodiment comprises one or more processors 31 and a memory 32. Specially, one processor 31 is taken as an example in FIG. 3.

The processor 31 and the memory 32 may be connected through a bus or in other ways. In FIG. 3, the connection through a bus is taken as an example.

The memory 32 is a non-volatile computer-readable storage medium based on reducing backlight crosstalk of an optical assembly, and can be used to store non-volatile software programs, non-volatile computer-executable programs and modules, such as methods for reducing a backlight crosstalk impact of an optical assembly and corresponding program instructions described in Embodiment 1. The processor 31 operates the non-volatile software programs, instructions, and modules stored in the memory 32 to execute various functional applications and data processing of the method for reducing the backlight crosstalk impact of the optical assembly, that is, to achieve the function of the methods for reducing the backlight crosstalk impact of the optical assembly in Embodiment 1.

The memory 32 may comprise a high-speed random access memory, and may also comprise a non-volatile memory, such as at least one of magnetic disk storage apparatus, flash memory apparatus, or other non-volatile solid-state storage apparatus. In some embodiments, the memory 32 may optionally comprise memories remotely provided with respect to the processor 31, which may be connected to the processor 31 via a network. Examples of the aforementioned networks comprise, but are not limited to, the Internet, corporate intranets, local area networks, mobile communication networks, and combinations thereof.

How to reduce the backlight crosstalk impact of the optical assembly by means of the apparatus of the present embodiment may refer to FIG. 1 to FIG. 2 and related descriptions, and will not be repeated herein.

It is worth noting that, the details of information interaction and execution process between the modules and units in the above-mentioned apparatus and system may refer to the description of the method embodiments of the present disclosure, since they are based on the same concept as the method embodiments of the present disclosure and thus will not be repeated herein.

Different from the prior arts, the present disclosure comprises: firstly sequentially collecting the backlight crosstalk data of the target wavelength channel to other wavelength channels at two different drive currents; then determining the function relationship expression for the crosstalk data of the target wavelength channel to other wavelength channels by the fitting method; and then calculating, by the linear accumulation method, the sum of crosstalk fitting data of other wavelength channels to the target wavelength channel; finally, subtracting the sum of the crosstalk fitting data of all the other wavelength channels to obtain the more accurate target backlight data and further the more accurate front light transmitting power, thereby reducing the backlight crosstalk impact. By means of the present disclosure, the crosstalk of backlight detection power of a wavelength channel can be reduced without adding additional light-blocking elements, such that the backlight crosstalk impact can be reduced, and the accuracy of the backlight detection can be improved, thus the more accurate front light transmitting power can be obtained, thereby well monitoring the optical assembly, and meanwhile, saving the costs and reducing the process difficulty.

It is obvious for those skilled in the art that that all or part of the steps in various methods of the embodiments can be completed by a program instructing relevant hardware. The program can be stored in a computer-readable storage medium comprising Read Only Memory (ROM), Random Access Memory (RAM), magnetic disk or optical disk, etc.

It is obvious for those skilled in the art that the above description is only some embodiments of the present invention and is not used for limiting the present invention. Any modification, equivalent replacement and improvement, etc. made within the spirit and principle of the present disclosure, shall be comprised in the protection scope of the present invention.

What is claimed is:

1. A method for reducing a backlight crosstalk impact of an optical assembly which comprises at least two wavelength channels, wherein the method for reducing a backlight crosstalk impact of an optical assembly comprises:

sequentially setting a laser drive current of a target wavelength channel as a first drive current, collecting backlight crosstalk data of the target wavelength channel to other wavelength channels, and generating a corresponding first crosstalk data matrix;

sequentially setting another laser drive current of the target wavelength channel as a second drive current, collecting backlight crosstalk data of the target wavelength channel to other wavelength channels, and generating a corresponding second crosstalk data matrix;

performing fitting on the first crosstalk data matrix and the second crosstalk data matrix to acquire a crosstalk data calibration matrix;

calculating target backlight data of the target wavelength channel according to the crosstalk data calibration matrix, so as to calculate front light transmitting power of the target wavelength channel according to the target backlight data, thereby monitoring the optical assembly according to the front light transmitting power.

2. The method for reducing a backlight crosstalk impact of an optical assembly of claim 1, wherein the step of calculating target backlight data of the target wavelength channel according to the crosstalk data calibration matrix, so as to calculate front light transmitting power of the target wavelength channel according to the target backlight data, thereby monitoring the optical assembly according to the front light transmitting power, comprises:

collecting backlight detection data of the target wavelength channel;

calculating a sum of crosstalk fitting data of backlight crosstalk to the target wavelength channel based on the crosstalk data calibration matrix and working currents of other wavelength channels;

subtracting the sum of crosstalk fitting data from the backlight detection data to acquire the target backlight data of the target wavelength channel, so as to calculate the front light transmitting power of the target wavelength channel according to the target backlight data, thereby monitoring the optical assembly according to the front light transmitting power.

3. The method for reducing a backlight crosstalk impact of an optical assembly of claim 2, wherein the step of calculating a sum of crosstalk fitting data of backlight crosstalk to the target wavelength channel based on the crosstalk data calibration matrix and working currents of other wavelength channels, comprises:

collecting a working current of each wavelength channel;

calculating crosstalk data of each wavelength channel to the target wavelength channel based on the crosstalk data calibration matrix and the working currents of other wavelength channels, and linearly adding up the crosstalk data to obtain the sum of crosstalk fitting data of backlight crosstalk to the target wavelength channel.

4. The method for reducing a backlight crosstalk impact of an optical assembly of claim 1, wherein the step of performing fitting on the first crosstalk data matrix and the second crosstalk data matrix to acquire a crosstalk data calibration matrix, comprises:

acquiring a slope matrix K and an intercept matrix B according to the first crosstalk data matrix and the second crosstalk data matrix;

performing linear fitting based on the slope matrix K and the intercept matrix B according to a first formula to acquire a crosstalk data calibration matrix Y;

the first formula being specifically:

$Y = K \times I_i + B;$ where $I_i$ represents a working current of an i-th wavelength channel.

5. The method for reducing a backlight crosstalk impact of an optical assembly of claim 1, wherein the optical assembly comprises n wavelength channels; the step of sequentially setting a laser drive current of a target wavelength channel as a first drive current, collecting backlight crosstalk data of the target wavelength channel to other wavelength channels, and generating a corresponding first crosstalk data matrix, comprises:

setting a laser drive current of an i-th wavelength channel as a first drive current $I_P$, and shutting down all other lasers, where $1 \leq i \leq n$;

collecting backlight crosstalk data $P_{ij}$ of the i-th wavelength channel to a j-th wavelength channel, where $1 \leq j \leq n$;

integrating the crosstalk data $P_{ij}$ to generate the corresponding first crosstalk data matrix.

6. The method for reducing a backlight crosstalk impact of an optical assembly of claim 1, wherein the step of setting another laser drive current of the target wavelength channel as a second drive current, collecting backlight crosstalk data of the target wavelength channel to other wavelength channels, and generating a corresponding second crosstalk data matrix, comprise:

setting another laser drive current of an i-th wavelength channel as a second drive current $I_q$, and shutting downing all other lasers, where $1 \leq i \leq n$;

collecting backlight crosstalk data $Q_{ij}$ of the i-th wavelength channel to a j-th wavelength channel, where $1 \leq j \leq n$;

integrating the crosstalk data $Q_{ij}$ to generate the corresponding second crosstalk data matrix.

7. The method for reducing a backlight crosstalk impact of an optical assembly of claim 1, wherein the step of sequentially setting a laser drive current of a target wavelength channel as a first drive current, collecting backlight crosstalk data of the target wavelength channel to other wavelength channels, and generating a corresponding first crosstalk data matrix, comprises:

setting a laser drive current of an i-th wavelength channel as a first drive current $I_P$, collecting backlight crosstalk data $P_{ij}$ of the i-th wavelength channel to a j-th wavelength channel, and integrating the crosstalk data $P_{ij}$ to generate the corresponding first crosstalk data matrix;

wherein the step of sequentially setting another laser drive current of the target wavelength channel as a second drive current, collecting backlight crosstalk data of the target wavelength channel to other wavelength channels, and generating a corresponding second crosstalk data matrix, comprises:

setting another laser drive current of the i-th wavelength channel as a second drive current $I_q$, collecting backlight crosstalk data $Q_{ij}$ of the i-th wavelength channel to the j-th wavelength channel, and integrating the crosstalk data $Q_{ij}$ to generate the corresponding second crosstalk data matrix;

wherein the step of performing fitting on the first crosstalk data matrix and the second crosstalk data matrix to acquire a crosstalk data calibration matrix, comprises:

acquiring a slope $K_{ij}$ according to a second formula, and integrating the slope $K_{ij}$ to obtain a slope matrix;

the second formula being specifically:

$$K_{ij} = \frac{P_{ij} - Q_{ij}}{I_P - I_q}$$

where the slope $K_{ij}$ represents a slope of a linear expression for crosstalk data of backlight of the i-th wavelength channel to the j-th wavelength channel;

acquiring an intercept $B_{ij}$ according to a third formula, and integrating the intercept $B_{ij}$ to obtain an intercept matrix;

the third formula being specifically:

$$B_{ij} = \frac{Q_{ij} \times I_p - P_{ij} \times I_q}{I_p - I_q}$$

where the intercept $B_{ij}$ represents an intercept of the linear expression for crosstalk data of backlight of the i-th wavelength channel to the j-th wavelength channel;

performing linear fitting based on the slope $K_{ij}$ and the intercept $B_{ij}$ according to a fourth formula to obtain a crosstalk data linear expression $Y_{ij}$ for the backlight crosstalk of the i-th wavelength channel to the j-th wavelength channel, and integrating the crosstalk data linear function expression equation $Y_{ij}$ to obtain the crosstalk data calibration matrix;

the fourth formula being specifically:

$$Y_{ij} = K_{ij} \times I_i + B_{ij}$$

where L represents a working current of the i-th wavelength channel.

8. The method reducing a backlight crosstalk impact of an optical assembly of claim 7, wherein the step of calculating target backlight data of the target wavelength channel according to the crosstalk data calibration matrix, so as to calculate front light transmitting power of the target wavelength channel according to the target backlight data, thereby monitoring the optical assembly according to the front light transmitting power, comprises:

calculating a crosstalk fitting data sum $C_m$ of crosstalk to a target wavelength channel m based on the crosstalk data calibration matrix according to a fifth formula;

the fifth formula being specifically:

$$C_m = \sum_{j=m}^{1 \le i \le n} Y_{ij}$$

where 1<m<n;

calculating the target backlight data of the target wavelength channel based on the crosstalk fitting data sum $C_m$, so as to calculate the front light transmitting power of the target wavelength channel according to the target backlight data, thereby monitoring the optical assembly according to the front light transmitting power.

9. The method reducing a backlight crosstalk impact of an optical assembly of claim 8, wherein the step of calculating the target backlight data of the target wavelength channel based on the crosstalk fitting data sum $C_m$, so as to calculate the front light transmitting power of the target wavelength channel according to the target backlight data, thereby monitoring the optical assembly according to the front light transmitting power, comprises:

collecting backlight detection data $D_m$ of the target wavelength channel m;

calculating target backlight data $D'_m$ of the target wavelength channel m according to a formula $$D'_m = D_m - C_m;$$

calculating the front light transmitting power of the target wavelength channel according to the target backlight data $D'_m$, so as to monitor the optical assembly according to the front light transmitting power.

10. An apparatus for reducing backlight crosstalk of an optical assembly, wherein the apparatus reducing backlight crosstalk of an optical assembly comprises:

at least one processor; and a memory communicatively connected with the at least one processor;

wherein the memory stores instructions executable by the at least one processor, and the instructions are configured by a program to execute the method for reducing a backlight crosstalk impact of an optical assembly which comprises at least two wavelength channels, wherein the method for reducing a backlight crosstalk impact of an optical assembly comprises:

sequentially setting a laser drive current of a target wavelength channel as a first drive current, collecting backlight crosstalk data of the target wavelength channel to other wavelength channels, and generating a corresponding first crosstalk data matrix;

sequentially setting another laser drive current of the target wavelength channel as a second drive current, collecting backlight crosstalk data of the target wavelength channel to other wavelength channels, and generating a corresponding second crosstalk data matrix;

performing fitting on the first crosstalk data matrix and the second crosstalk data matrix to acquire a crosstalk data calibration matrix;

calculating target backlight data of the target wavelength channel according to the crosstalk data calibration matrix, so as to calculate front light transmitting power of the target wavelength channel according to the target backlight data, thereby monitoring the optical assembly according to the front light transmitting power.

11. A method for reducing a backlight crosstalk impact of an optical assembly which comprises at least two wavelength channels, wherein the method for reducing a backlight crosstalk impact of an optical assembly comprises:

sequentially setting a laser drive current of a target wavelength channel as a first drive current, collecting backlight crosstalk data of the target wavelength channel to other wavelength channels, and generating a corresponding first crosstalk data matrix;

sequentially setting another laser drive current of the target wavelength channel as a second drive current, collecting backlight crosstalk data of the target wavelength channel to other wavelength channels, and generating a corresponding second crosstalk data matrix;

performing fitting on the first crosstalk data matrix and the second crosstalk data matrix to acquire a crosstalk data calibration matrix;

calculating target backlight data of the target wavelength channel according to the crosstalk data calibration matrix, so as to calculate front light transmitting power of the target wavelength channel according to the target backlight data, thereby monitoring the optical assembly according to the front light transmitting power; and wherein the step of calculating target backlight data of the target wavelength channel according to the crosstalk data calibration matrix, so as to calculate front light transmitting power of the target wavelength channel according to the target backlight data, thereby monitoring the optical assembly according to the front light transmitting power, comprises:

collecting backlight detection data of the target wavelength channel;

calculating a sum of crosstalk fitting data of backlight crosstalk to the target wavelength channel based on the crosstalk data calibration matrix and working currents of other wavelength channels; and subtracting the sum of crosstalk fitting data from the backlight detection data to acquire the target backlight data of the target wavelength channel, so as to calculate the front light transmitting power of the target wavelength channel according to the target backlight data, thereby monitoring the optical assembly according to the front light transmitting power.

12. The method for reducing a backlight crosstalk impact of an optical assembly of claim 11, wherein the step of calculating a sum of crosstalk fitting data of backlight crosstalk to the target wavelength channel based on the crosstalk data calibration matrix and working currents of other wavelength channels, comprises:

collecting a working current of each wavelength channel;

calculating crosstalk data of each wavelength channel to the target wavelength channel based on the crosstalk data calibration matrix and the working currents of other wavelength channels, and linearly adding up the crosstalk data to obtain the sum of crosstalk fitting data of backlight crosstalk to the target wavelength channel.

13. The method for reducing a backlight crosstalk impact of an optical assembly of claim 11, wherein the step of performing fitting on the first crosstalk data matrix and the second crosstalk data matrix to acquire a crosstalk data calibration matrix, comprises:

acquiring a slope matrix K and an intercept matrix B according to the first crosstalk data matrix and the second crosstalk data matrix;

performing linear fitting based on the slope matrix K and the intercept matrix B according to a first formula to acquire a crosstalk data calibration matrix Y;

the first formula being specifically:

$$Y = K \times I_i + B;$$

where $I_i$ represents a working current of an i-th wavelength channel.

14. The method for reducing a backlight crosstalk impact of an optical assembly of claim 11, wherein the optical assembly comprises n wavelength channels; the step of sequentially setting a laser drive current of a target wavelength channel as a first drive current, collecting backlight crosstalk data of the target wavelength channel to other wavelength channels, and generating a corresponding first crosstalk data matrix, comprises:

setting a laser drive current of an i-th wavelength channel as a first drive current $I_P$, and shutting down all other lasers, where 1<i<n;

collecting backlight crosstalk data $P_{ij}$ of the i-th wavelength channel to a j-th wavelength channel, where 1<j<n;

integrating the crosstalk data $P_{ij}$ to generate the corresponding first crosstalk data matrix.

15. The method for reducing a backlight crosstalk impact of an optical assembly of claim 11, wherein the step of setting another laser drive current of the target wavelength channel as a second drive current, collecting backlight crosstalk data of the target wavelength channel to other wavelength channels, and generating a corresponding second crosstalk data matrix, comprise:

setting another laser drive current of an i-th wavelength channel as a second drive current $I_q$, and shutting downing all other lasers, where 1<i<n;

collecting backlight crosstalk data $Q_{ij}$ of the i-th wavelength channel to a j-th wavelength channel, where 1<j<n;

integrating the crosstalk data $Q_{ij}$ to generate the corresponding second crosstalk data matrix.

16. The method for reducing a backlight crosstalk impact of an optical assembly of claim 11, wherein the step of sequentially setting a laser drive current of a target wavelength channel as a first drive current, collecting backlight crosstalk data of the target wavelength channel to other wavelength channels, and generating a corresponding first crosstalk data matrix, comprises:

setting a laser drive current of an i-th wavelength channel as a first drive current $I_P$, collecting backlight crosstalk data $P_{ij}$ of the i-th wavelength channel to a j-th wavelength channel, and integrating the crosstalk data $P_{ij}$ to generate the corresponding first crosstalk data matrix;

wherein the step of sequentially setting another laser drive current of the target wavelength channel as a second drive current, collecting backlight crosstalk data of the target wavelength channel to other wavelength channels, and generating a corresponding second crosstalk data matrix, comprises:

setting another laser drive current of the i-th wavelength channel as a second drive current $I_q$, collecting backlight crosstalk data $Q_{ij}$ of the i-th wavelength channel to the j-th wavelength channel, and integrating the crosstalk data $Q_{ij}$ to generate the corresponding second crosstalk data matrix;

wherein the step of performing fitting on the first crosstalk data matrix and the second crosstalk data matrix to acquire a crosstalk data calibration matrix, comprises:

acquiring a slope $K_{ij}$ according to a second formula, and integrating the slope $K_{ij}$ to obtain a slope matrix;

the second formula being specifically:

$$K_{ij} = \frac{P_{ij} - Q_{ij}}{I_P - I_q}$$

where the slope $K_{ij}$ represents a slope of a linear expression for crosstalk data of backlight of the i-th wavelength channel to the j-th wavelength channel;

acquiring an intercept $B_{ij}$ according to a third formula, and integrating the intercept $B_{ij}$ to obtain an intercept matrix;

the third formula being specifically:

$$B_{ij} = \frac{Q_{ij} \times I_P - P_{ij} \times I_q}{I_P - I_q}$$

where the intercept $B_{ij}$ represents an intercept of the linear expression for crosstalk data of backlight of the i-th wavelength channel to the j-th wavelength channel;

performing linear fitting based on the slope $K_{ij}$ and the intercept $B_{ij}$ according to a fourth formula to obtain a crosstalk data linear expression $Y_{ij}$ for the backlight crosstalk of the i-th wavelength channel to the j-th wavelength channel, and integrating the crosstalk data linear function expression equation $Y_{ij}$ to obtain the crosstalk data calibration matrix;

the fourth formula being specifically:

$$Y_{ij} = K_{ij} \times I_i + B_{ij}$$

where $I_i$ represents a working current of the i-th wavelength channel.

17. The method reducing a backlight crosstalk impact of an optical assembly of claim 16, wherein the step of calculating target backlight data of the target wavelength channel according to the crosstalk data calibration matrix, so as to calculate front light transmitting power of the target wavelength channel according to the target backlight data, thereby monitoring the optical assembly according to the front light transmitting power, comprises:

calculating a crosstalk fitting data sum $C_m$ of crosstalk to a target wavelength channel m based on the crosstalk data calibration matrix according to a fifth formula;

the fifth formula being specifically:

$$C_m = \sum_{j=m}^{1 \leq i \leq n} Y_{ij}$$

where 1<m<n;

calculating the target backlight data of the target wavelength channel based on the crosstalk fitting data sum $C_m$, so as to calculate the front light transmitting power of the target wavelength channel according to the target backlight data, thereby monitoring the optical assembly according to the front light transmitting power.

18. The method reducing a backlight crosstalk impact of an optical assembly of claim 17, wherein the step of calculating the target backlight data of the target wavelength channel based on the crosstalk fitting data sum $C_m$, so as to calculate the front light transmitting power of the target wavelength channel according to the target backlight data, thereby monitoring the optical assembly according to the front light transmitting power, comprises:

collecting backlight detection data $D_m$ of the target wavelength channel m;

calculating target backlight data $D'_m$ of the target wavelength channel m according to a formula $$D'_m = D_m - C_m;$$

calculating the front light transmitting power of the target wavelength channel according to the target backlight data $D'_m$, so as to monitor the optical assembly according to the front light transmitting power.

* * * * *